(12) United States Patent
Mizuhara et al.

(10) Patent No.: US 7,733,668 B2
(45) Date of Patent: Jun. 8, 2010

(54) HYBRID INTEGRATED CIRCUIT DEVICE AND METHOD FOR MANUFACTURING SAME

(75) Inventors: Seitaro Mizuhara, Kyoto (JP); Naoya Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/083,039

(22) PCT Filed: Oct. 2, 2006

(86) PCT No.: PCT/JP2006/319672

§ 371 (c)(1),
(2), (4) Date: Jul. 10, 2008

(87) PCT Pub. No.: WO2007/040193

PCT Pub. Date: Apr. 12, 2007

(65) Prior Publication Data

US 2008/0278920 A1    Nov. 13, 2008

(30) Foreign Application Priority Data

Oct. 3, 2005    (JP) .............................. 2005-289700

(51) Int. Cl.
*H05K 1/11* (2006.01)
*H05K 1/14* (2006.01)
(52) U.S. Cl. .................. 361/804; 361/770; 361/805

(58) Field of Classification Search ............... 361/770, 361/790, 804–810
See application file for complete search history.

(56) References Cited

U.S. PATENT DOCUMENTS

| | | | | |
|---|---|---|---|---|
| 5,588,848 | A | * 12/1996 | Law et al. | 439/83 |
| 5,969,952 | A | * 10/1999 | Hayashi et al. | 361/774 |
| 7,246,434 | B1 | * 7/2007 | Taylor et al. | 29/852 |

FOREIGN PATENT DOCUMENTS

| | | |
|---|---|---|
| JP | 6-275774 | 9/1994 |
| JP | 10-74887 | 3/1998 |
| JP | 2004-172422 | 6/2004 |

* cited by examiner

*Primary Examiner*—Tuan T Dinh
(74) *Attorney, Agent, or Firm*—Hamre, Schumann, Mueller & Larson, P.C.

(57) ABSTRACT

A hybrid integrated circuit device includes: an insulating substrate (1) having a lower surface formed with wiring patterns including ends arranged along ends of the lower surface at a predetermined pitch (P); electronic components (3) mounted on the surfaces of the insulating substrate to be connected to the wiring patterns; a pair of insulating legs (2) arranged at the ends of the lower surface of the substrate (1), each insulating leg extending in parallel to the lower surface of the substrate (1); and a plurality of terminal electrodes (5) formed on each leg at the pitch and extending perpendicularly to the substrate, where the plurality of terminal electrodes are connected to the wiring patterns on the lower surface of the substrate (1). Each leg has a surface bonded to the substrate and formed with electrode films connected to the terminal electrodes. Each leg is fixed to the substrate by attaching the terminal electrodes to the wiring patterns on the lower surface of the substrate (1) by soldering or by an electroconductive paste.

3 Claims, 8 Drawing Sheets

HYBRID INTEGRATED CIRCUIT DEVICE AND METHOD FOR MANUFACTURING SAME

TECHNICAL FIELD

The present invention relates to a hybrid integrated circuit device incorporating electronic components mounted on the upper surface and/or lower surface of an insulating substrate, while also relating to a method for manufacturing such a hybrid integrated circuit device.

BACKGROUND ART

A conventional hybrid integrated circuit device includes an insulating substrate and electronic components mounted on the upper surface and/or lower surface of the substrate. To mount such a hybrid integrated circuit device to a motherboard or other kinds of circuit boards, use is made of a plurality of clip terminals soldered to each end of the insulating substrate at a predetermined pitch along the end.

Each of the clip terminals comprises a wire whose end is bent into a clip. In addition to being used for receiving the clip terminals, the ends of the insulating substrate are formed with a plurality of electrodes arranged at a predetermined pitch to be connected to a wiring pattern for electrically connecting the clip terminals to the electronic components mounted on the insulating substrate. Each of the clip terminals is clipped to the end of the insulating substrate and then secured to the substrate by soldering.

In recent years, an increasing number of electronic components are incorporated into hybrid integrated circuit devices. At the same time, there are demands for reducing the size of a hybrid integrated circuit device. In the conventional hybrid integrated circuit device described above, a certain amount of area needs to be kept for soldering the clip terminals at the ends of the insulating substrate. Thus, the area that can be used for mounting electronic components is reduced, which makes it difficult to meet the above demands for a hybrid integrated circuit device. Conventionally, to overcome this difficulty, various terminal structures of a hybrid integrated circuit device have been proposed for increasing the number of electronic components without increasing the size of the insulating substrate.

For instance, in the terminal structure disclosed in Patent Document 1 below, the clip terminals are replaced with prism-shaped, insulating members which are bonded to a region (a lower region) of the ends (corresponding to the ends used for mounting the clip terminals) of the insulating substrate in a horizontally extending manner, each insulating member having an outer surface formed with terminal electrodes that correspond to the clip terminals. With this arrangement, the area for mounting electronic components on the other surface (the upper surface) of the insulating substrate is increased.

FIGS. 13-15 show the terminal structure of a hybrid integrated circuit device disclosed in Patent Document 1.

The hybrid integrated circuit device includes an insulating substrate 11 having an upper and a lower surfaces on which a plurality of electronic components 13 are mounted. Wiring patterns 14 (see FIG. 15) for the electronic components 13 are formed at the ends of the lower surface of the insulating substrate 11. The wiring patterns 14 are arranged at a predetermined pitch P along each of the side surfaces 11a of the insulating substrate 11. Legs 12 each comprising an insulating member in the form of a bar having a rectangular cross section are mounted to the ends of the lower surface of the insulating substrate 11 to extend horizontally (i.e., the longitudinal side extends in parallel with the surface of the insulating substrate 11).

A plurality of grooves 15 are formed at the outwardly-oriented side surface (hereinafter referred to as "outer side surface") of each of the legs 12. The grooves 5 are arranged at the pitch P in the longitudinal direction of the leg 12. A terminal electrode 16 is formed in each of the grooves 15. Each of the terminal electrodes 16 is electrically connected to the wiring pattern 14 formed on the lower surface of the insulating substrate 11. The hybrid integrated circuit device is mounted on a circuit board such as a motherboard by soldering each of the terminal electrodes 16 onto a wiring pattern formed on the circuit board.

With this structure of the hybrid integrated circuit device, it is unnecessary to secure the soldering area for connecting terminals such as clip terminals at the ends of the upper surface of the insulating substrate 11. Thus, the area for mounting electronic components 13 is relatively large, so that a relatively large number of electronic components 13 can be mounted.

The Patent Document 1 also discloses a method for forming a plurality of terminal electrodes 16 on an outer side surface of each leg 12.

The method proceeds as follows:

(1) A material board large enough to provide a plurality of insulating substrates 11 arranged side by side is prepared;

(2) A leg material having a width corresponding to two legs is bonded to the lower surface of the material board along each boundary line between adjacent insulating substrates 11;

(3) A plurality of through-holes are formed in the leg material at a predetermined pitch P along the boundary line, and the inner surface of each through-hole is plated with an electroconductive material to provide a via hole. Wiring patterns 14 are formed in advance on the insulating substrate 11 at locations at which the via holes are to be formed. Thus, each of the via holes is electrically connected to the wiring pattern 14; and (4) The material board to which the leg material is bonded is cut along the boundary lines.

In the process (4), when the material board to which the leg material is bonded is cut, each of the via holes is divided into two parts. As a result, the divided surface forms a semicircular groove 15, and the conductor plated in the groove 15 appears as a terminal electrode 16.

Patent Document 1: JP-A-2004-172422

DISCLOSURE OF THE INVENTION

Problems to be Solved by the Invention

In the hybrid integrated circuit device disclosed in the Patent Document 1, the legs 12 are fixed to the ends of the lower surface of the insulating substrate 11 by bonding. Thus, the bonding strength of the legs 12 to the insulating substrate 11 is high. However, the terminal electrodes 16 formed on the outer side surface of each leg 11 comprise only the conductor for plating the grooves 15 of the leg 11. Thus, as shown in FIG. 15, the conductor and the wiring pattern 14 on the insulating substrate 11 are connected to each other only at a linear portion, and the connection area is extremely small. Thus, the electrical connection between the terminal electrode 16 and the wiring pattern is unreliable. As a result, connection failure is likely to occur at the connection portion between the terminal electrode 16 and the wiring pattern, which leads to an increase in the number of defective products.

The technical object of the present invention is to provide a hybrid integrated circuit device and a method for manufacturing a hybrid integrated circuit device which are capable of solving the above-described problems.

Means for Solving the Problems

According to a first aspect of the present invention, there is provided a hybrid integrated circuit device comprising: an insulating substrate including a lower surface formed with a plurality of wiring patterns for external connection, the plurality of wiring patterns including ends arranged along ends of the lower surface at a predetermined pitch; electronic components mounted on at least one of an upper surface and the lower surface of the insulating substrate, the electronic components being connected to the wiring patterns; a pair of insulating legs arranged at the ends of the lower surface of the insulating substrate, each of the insulating legs extending in parallel to the lower surface of the insulating substrate; and a plurality of terminal electrodes formed on each of the legs at the predetermined pitch to extend perpendicularly to the insulating substrate, the plurality of terminal electrodes being connected to corresponding ones of the wiring patterns formed on the lower surface of the insulating substrate. Each of the legs has a surface which is bonded to the insulating substrate and formed with a plurality of electrode films connected to the terminal electrodes. Each of the legs is fixed to the insulating substrate by attaching the terminal electrodes to the corresponding ones of the wiring patterns on the lower surface of the insulating substrate by soldering or by adhesion of an electroconductive paste.

Preferably, each of the legs may include an outer side surface formed with a plurality of grooves arranged at a predetermined pitch, where the terminal electrodes are provided in the grooves.

Preferably, each of the legs may include an inner side surface formed with a plurality of grooves arranged correspondingly to the grooves in the outer side surface of the leg, where the grooves in the inner side surface are formed with terminal electrodes. The electrode films connect the terminal electrodes in the grooves in the outer side surface of the leg to corresponding ones of the terminal electrodes in the grooves in the inner side surface of the leg.

According to a second aspect of the present invention, there is provided a method for manufacturing a hybrid integrated circuit device. The method comprises: a first step of mounting an electronic component on an upper surface or a lower surface of an insulating substrate, the lower surface formed with a plurality of wiring patterns for external connection, the wiring patterns having ends arranged along ends of the lower surface at a predetermined pitch; a second step of preparing an elongated, insulating leg including a side surface provided with a plurality of terminal electrodes arranged at the predetermined pitch in a longitudinal direction of the leg, the leg further including a surface which is attached to the insulating substrate and formed with a plurality of electrode films connected to the terminal electrodes; and a third step of fixing the leg to the end of the lower surface of the insulating substrate by attaching the terminal electrodes on the leg to corresponding ones of the wiring patterns on the lower surface of the insulating substrate through soldering or through adhesion of an electroconductive paste.

Preferably, the third step may comprise: preparing a material board integrally including a plurality of legs arranged side by side; forming a plurality of through-holes in the material board at the predetermined pitch along a boundary line between adjacent legs; forming an electrode in each of the through-holes to form a via hole for providing a terminal electrode, and forming an electrode film to connect a plurality of via holes aligned in a direction perpendicular to the boundary line; and cutting the material board along the boundary line to provide separate legs.

According to the present invention, the bonding strength of the legs and the insulating substrate is secured, whereby the number of defective products is increased considerably.

BEST MODE FOR CARRYING OUT THE INVENTION

Figure 1:
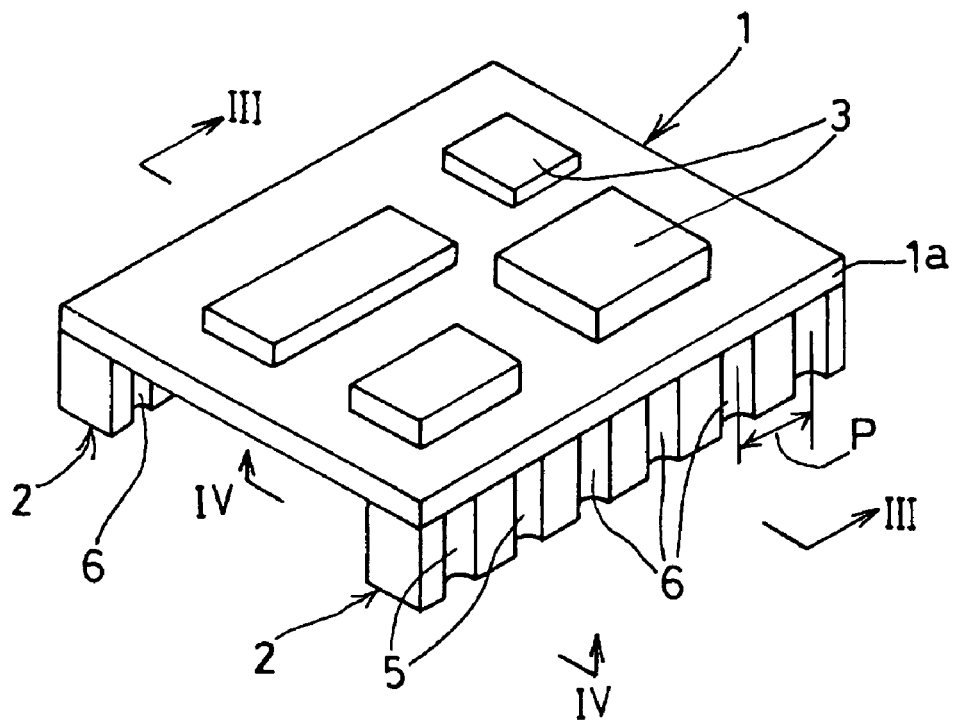
FIG. 1 is a perspective view showing a hybrid integrated circuit device according to an embodiment of the present invention.
Figure 2:
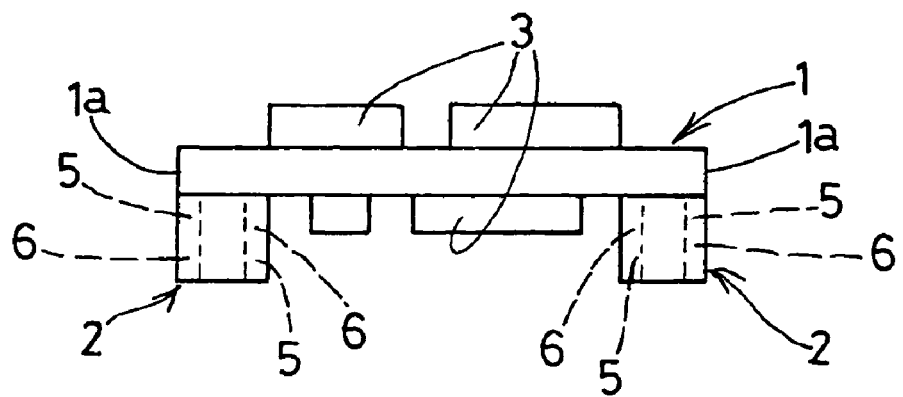
FIG. 2 is a side view of FIG. 1.

Preferred embodiments of the present invention will be described below with reference to the accompanying drawings.

FIGS. 1-4 show a hybrid integrated circuit device according to an embodiment of the present invention.

In the illustrated hybrid integrated circuit device, an insulating substrate 1 has a "lower surface" on which legs 2 are provided, and an "upper surface" which is opposite to the lower surface. Further, each leg 2 has an "upper surface" through which the leg is connected to the substrate 1, a "lower surface" which is opposite to the upper surface, and two "right and left" side surfaces which are perpendicular to the upper and the lower surfaces, where one of the side surfaces is arranged to face the other leg 2, and the other side surface is opposite to this first side surface.

A plurality of electronic components 3 are mounted on the upper and the lower surfaces of the insulating substrate 1. Wiring patterns 4 (see FIG. 3) for the electronic components 3 are formed at ends of the lower surface of the insulating substrate 1. The wiring patterns 4 are arranged at a predetermined pitch P along each of the side surfaces 1a of the insulating substrate 1. Each of the legs 2 comprises a bar-shaped insulating member having a rectangular cross section. The legs 2, attached to the ends of the lower surface of the insulating substrate 1, extend horizontally (i.e., with its longitudinal axis being parallel to the upper or lower surface of the insulating substrate 1).

The legs 2 are made of an insulating material such as heat-resistant synthetic resin. Each of the side surfaces of each leg 2 is formed with a plurality of grooves 5 elongated vertically and having a semicircular cross section. The grooves 5 are arranged at the same pitch P, and each of the grooves 5 is formed with a terminal electrode 6.

The upper surface of each leg 2 is formed with upper electrode films 7 each of which is arranged between two mutually opposite grooves 5 and connected to a corresponding pair of the terminal electrodes 6 formed on the right and left side surfaces. Likewise, the lower surface of each leg 2 is formed with lower electrode films 8 each of which is arranged between two mutually opposite grooves 5 and connected to a corresponding pair of the terminal electrodes 6 formed on the right and left side surfaces.

Each of the legs 2, provided at the ends of the lower surface of the insulating substrate 1, is fixed to the insulating substrate 1 via an electroconductive paste or by soldering the terminal electrodes 6 to the wiring patterns 4 on the lower surface of the insulating substrate 1.

As noted above, the terminal electrodes 6 are formed in the grooves 5 on the side surfaces of the leg 2. Thus, the applied molten solder or electroconductive paste will bulge in the grooves 5, and connect the electrodes to the insulating substrate 1. In this manner, the bonding strength between the leg 2 and the insulating substrate 1 and the electrical connection between the terminal electrodes 6 and the wiring patterns 4 are enhanced. Consequently, each leg 2 is attached firmly to the insulating substrate 1, and the terminal electrodes 6 on the leg 2 are electrically connected to the wiring patterns 4 on the insulating substrate 1 reliably and strongly.

Further, no bridge of molten solder or electroconductive paste is formed between adjacent terminal electrodes 6 provided in the grooves 5 on the same side. As a result, the ratio of defective products with improper electrical connection is considerably reduced.

Figure 3:
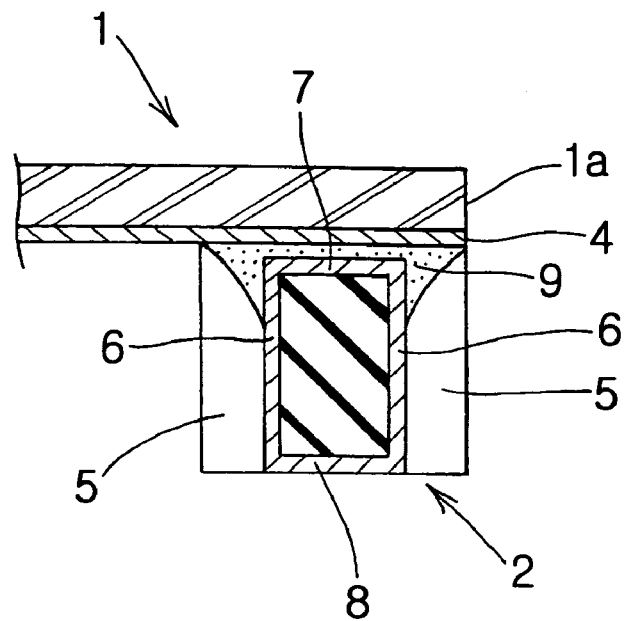
FIG. 3 is an enlarged sectional view taken along III-III in FIG. 1.
Figure 4:
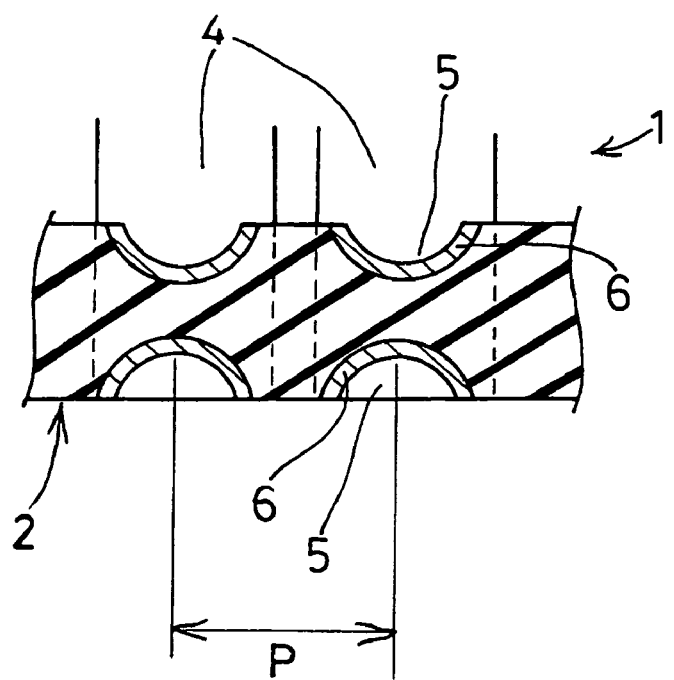
FIG. 4 is an enlarged sectional view taken along VI-VI in FIG. 1.

Still further, in soldering each of the legs 2 to the insulating substrate 1, the molten solder 9 bulges in the grooves 5 at the side surfaces of the leg 2 (see FIG. 3), and the bulging of the molten solder 9 on the sides prevents undesired movement of the leg 2 in the lateral direction in FIG. 3. In this way, the bulged molten solder 9 exhibits a self-alignment effect, i.e., holds the leg 2 at a predetermined position, so that the leg 2 is accurately fixed in parallel or generally in parallel with the side surface 1a of the insulating substrate 1.

In addition, by the provision of the upper electrode films 7 on the upper surface of each leg 2, the area for soldering or the area for bonding using an electroconductive paste is increased. Thus, each of the terminal electrodes 6 is reliably connected to the wiring pattern 4.

The lower electrode films 8 are formed on the lower surface of each leg 2, as noted above. Thus, the hybrid integrated circuit device can be reliably and strongly mounted to a circuit board such as a motherboard by soldering.

The hybrid integrated circuit device having the above-described structure may be manufactured by the process described below.

First, an insulating substrate 1 is prepared, and electronic components 3 are mounted on the insulating substrate 1.

Figure 5:
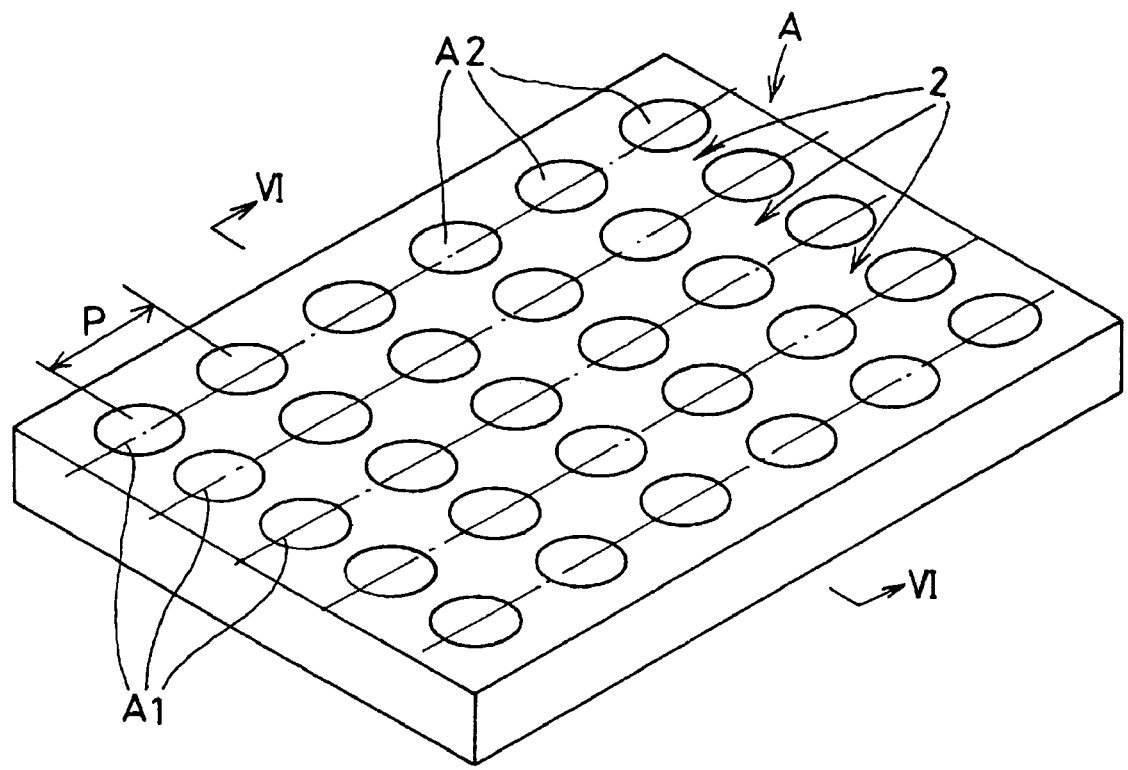
FIG. 5 is a perspective view showing a material board for manufacturing legs according to the present invention.
Figure 6:
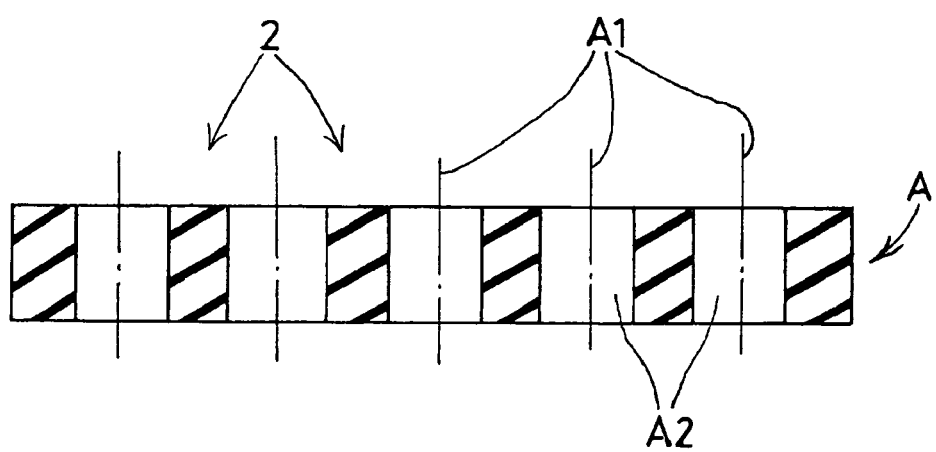
FIG. 6 is an enlarged sectional view taken along lines VI-VI in FIG. 5.

Meanwhile, as shown in FIGS. 5 and 6, a material board A is prepared, which is large enough to provide a plurality of legs 2 integrally arranged side by side. Then, a plurality of through-holes for grooves 5 are formed in the material board A at a predetermined pitch P along each of the boundary lines A1 between the legs 2.

Figure 7:
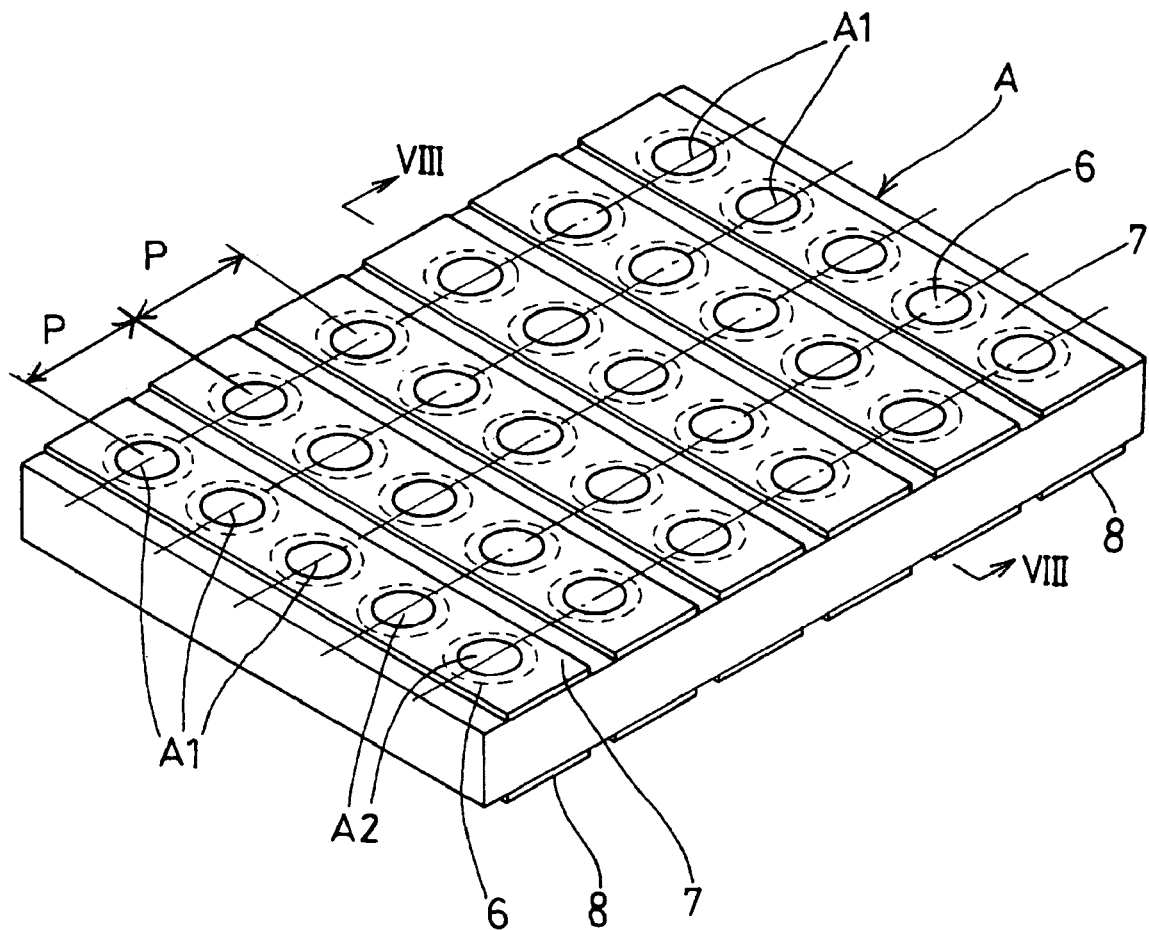
FIG. 7 is a perspective view showing a material board on which electrodes are formed.
Figure 8:
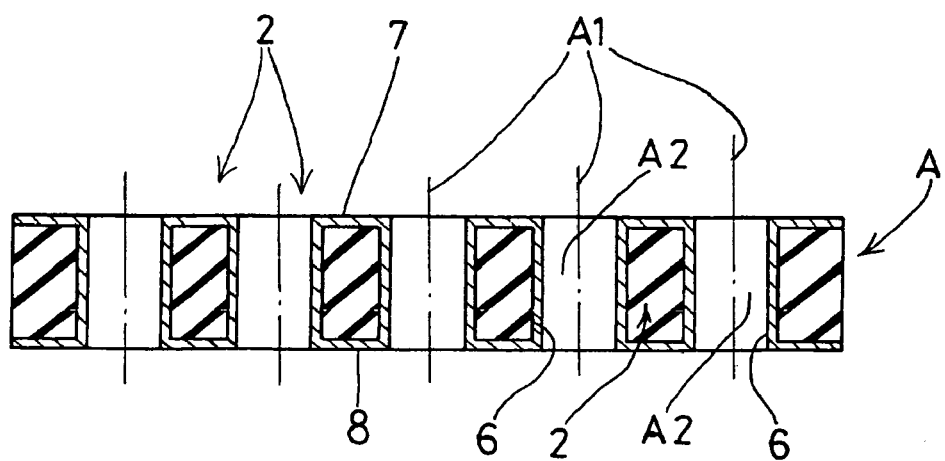
FIG. 8 is a sectional view taken along lines VIII-VIII in FIG. 7.

Then, as shown in FIGS. 7 and 8, to form via holes A2, an electrode (corresponding to the terminal electrode 6) is formed on the inner surface of each of the through-holes in the material board A. Upper electrode films 7 are formed on the upper surface of the material board A to connect the via holes A2 to each other in a direction perpendicular to the boundary lines A1. Lower electrode films 8 are formed on the lower surface of the material board A to connect the via holes A2 to each other in the direction perpendicular to the boundary lines A1. The formation of the terminal electrode 6 in each via hole A2 and the formation of the upper and the lower electrode films 7 and 8 are performed by electroless plating, for example.

Figure 9:
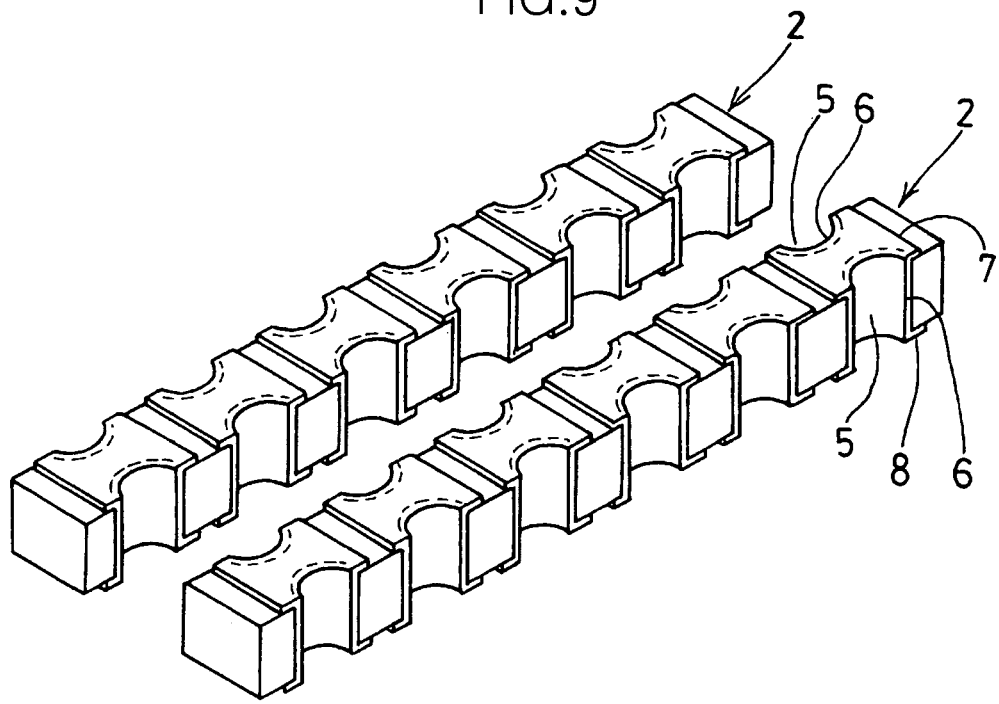
FIG. 9 is a perspective view showing legs obtained by dividing the material board.

Then, the material board A is divided along the boundary lines A1 by e.g. dicing into a plurality of separate legs 2, as shown in FIG. 9.

Figure 10:
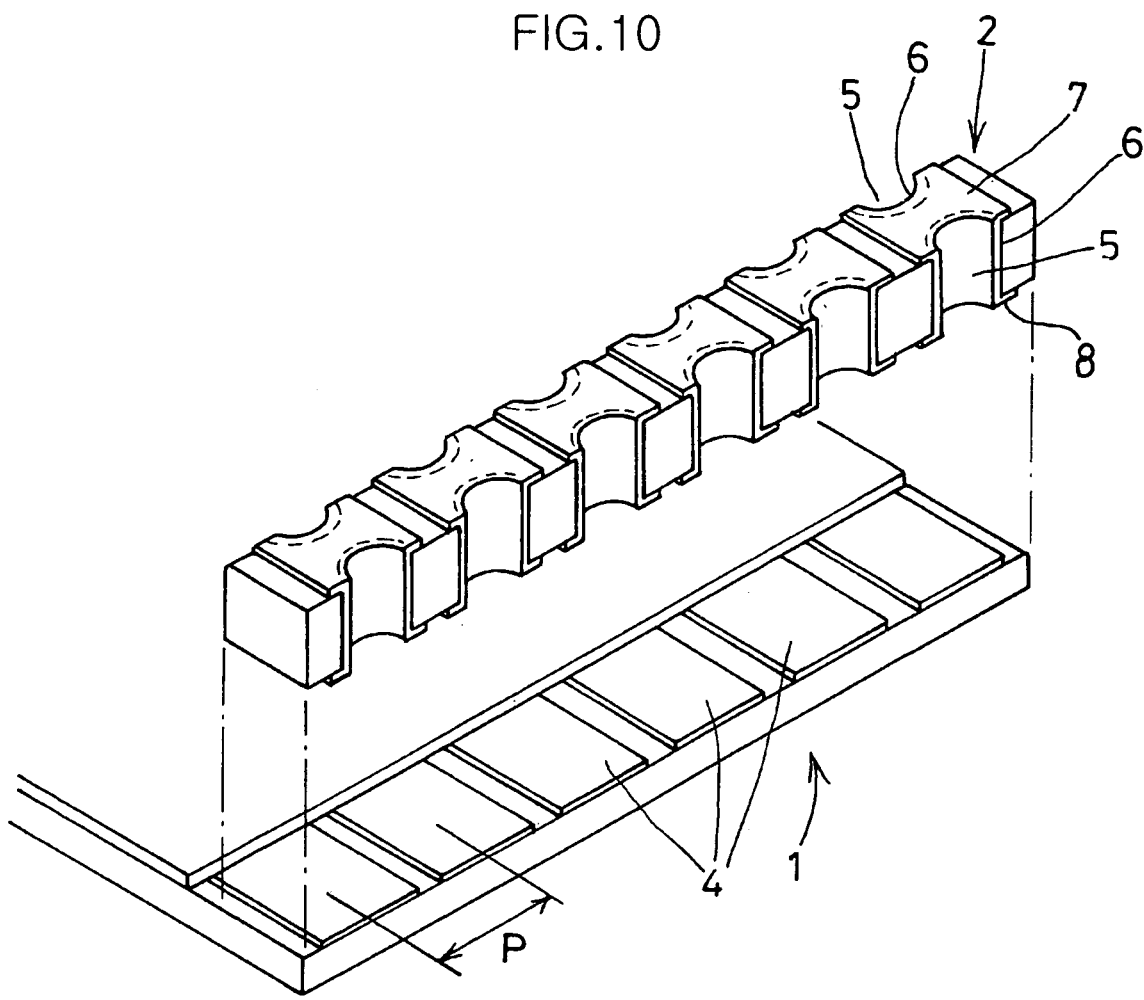
FIG. 10 is a perspective view showing the manner of placing a leg onto an insulating substrate.
Figure 11:
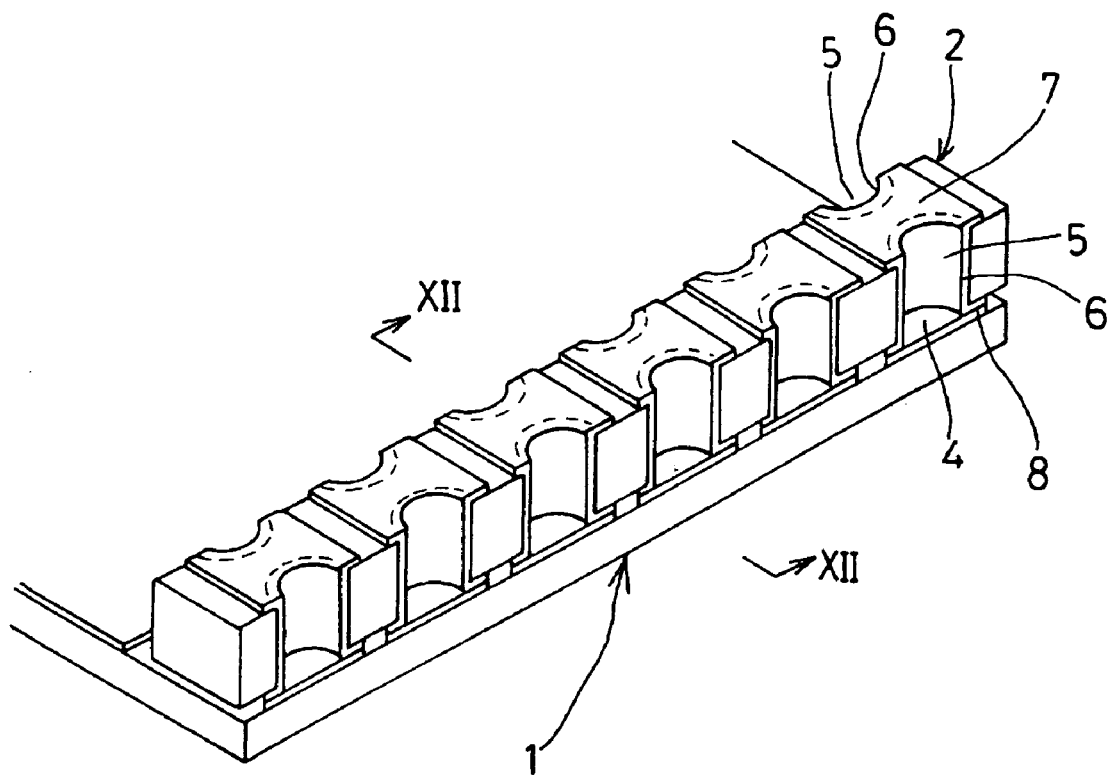
FIG. 11 is a perspective view showing a leg soldered onto an insulating substrate.
Figure 12:
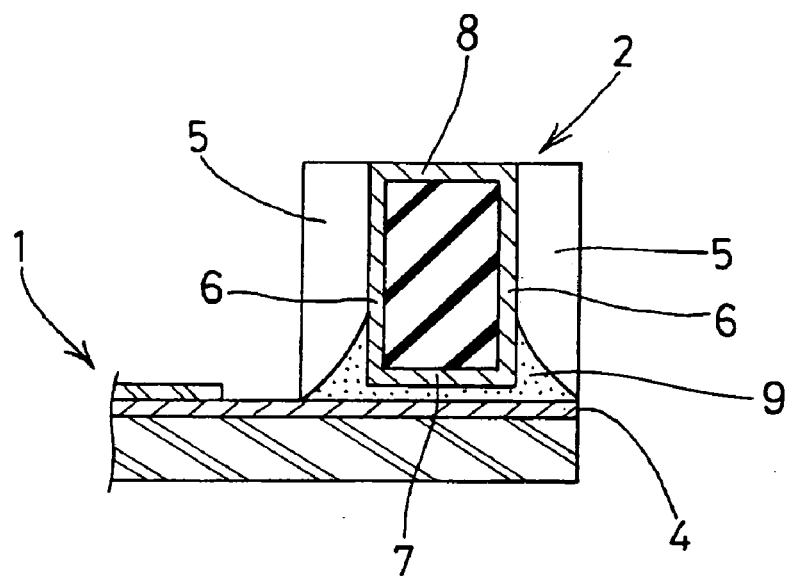
FIG. 12 is an enlarged sectional view taken along lines XII-XII in FIG. 11.
Figure 13:
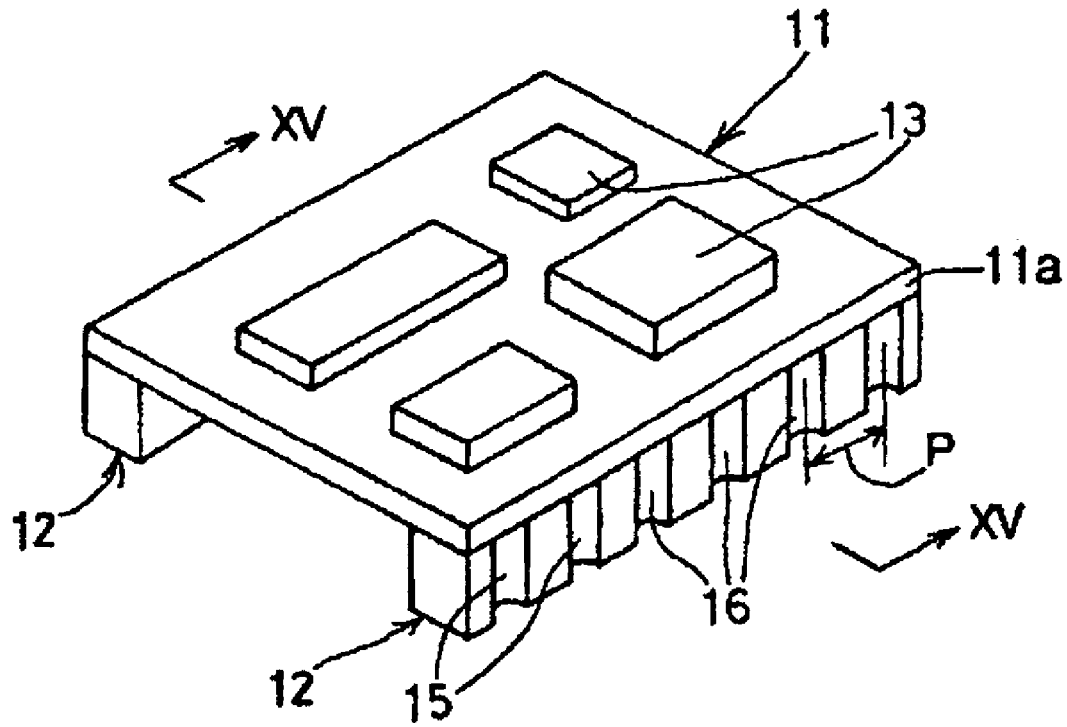
FIG. 13 is a perspective view showing a hybrid integrated circuit device disclosed in Patent Document 1.
Figure 14:
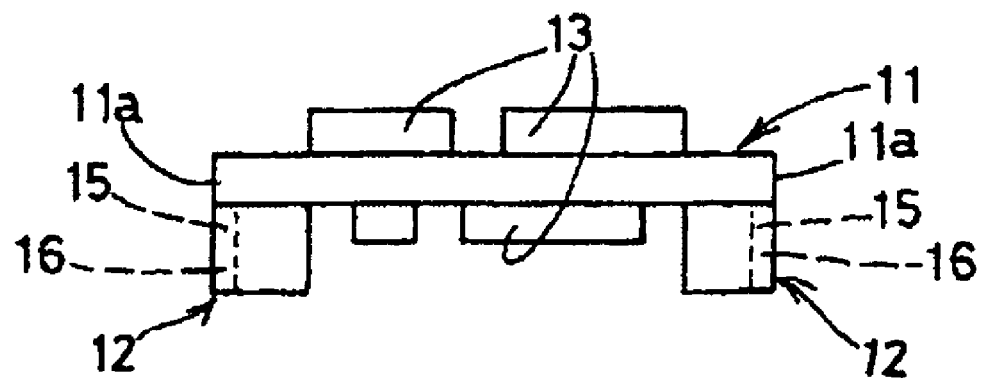
FIG. 14 is an enlarged sectional view taken along lines XV-XV in FIG. 13.
Figure 15:
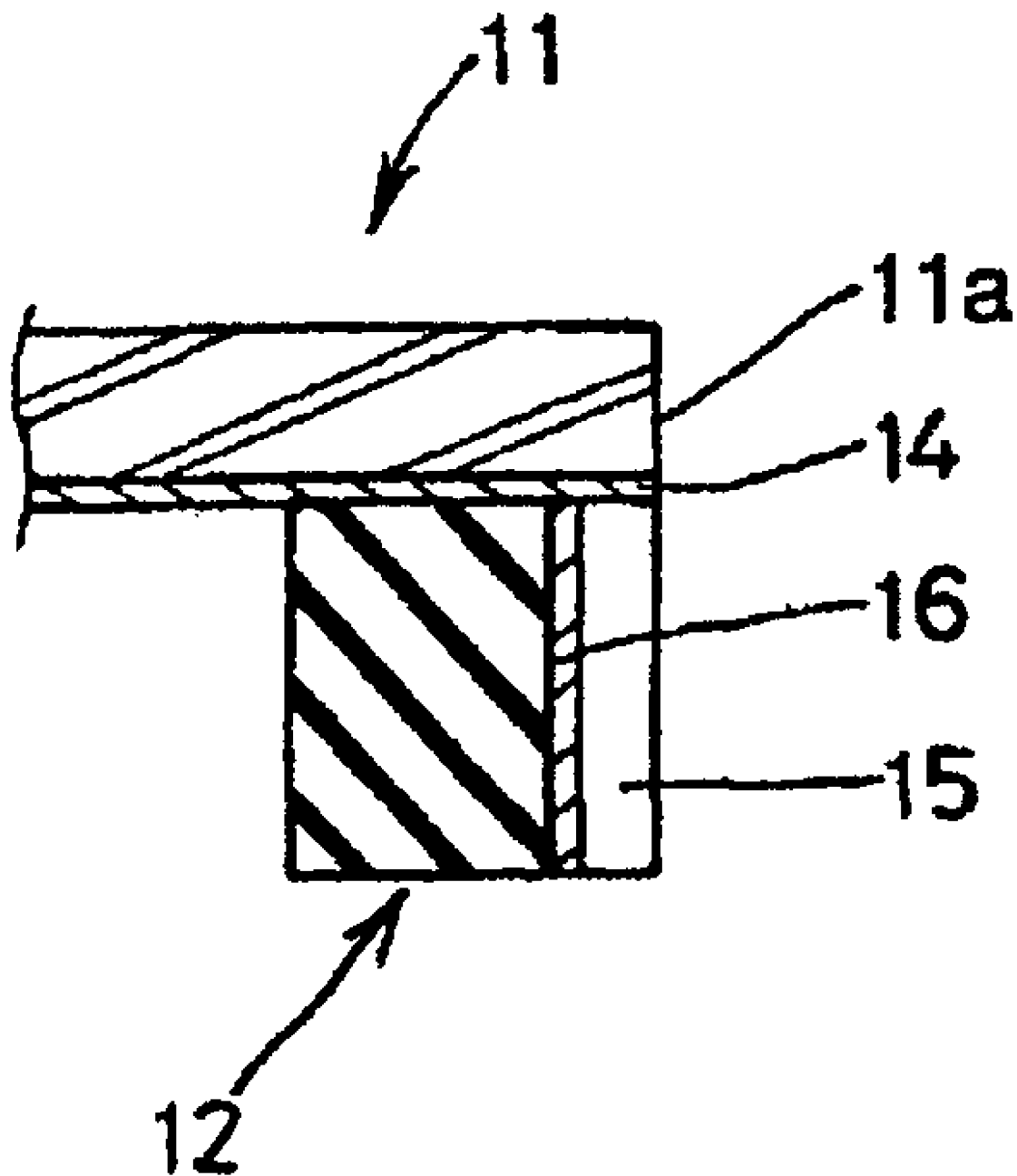
FIG. 15 is a sectional view showing the electrical connection between a terminal electrode of a leg and a wiring pattern of FIG. 14.

Then, as shown in FIG. 10, the leg 2 is placed on the lower surface of the insulating substrate 1. Then, as shown in FIGS. 11 and 12, the electrode films 8 of the leg 2 are soldered onto the corresponding wiring patterns 4. In this process, the molten solder 9 bulges in the grooves 5 on the side surfaces of the leg 2.

By the above-described process, hybrid integrated circuit devices each having the structure shown in FIGS. 1-4 are manufactured.

According to the above-described method, a plurality of legs 2, each formed with a plurality of grooves 5 on the side surfaces, can be manufactured readily and collectively. Thus, the hybrid integrated circuit device of the present invention can be manufactured at a low cost.

The invention claimed is:

1. A hybrid integrated circuit device comprising:
   an insulating substrate including an upper surface and a lower surface, the lower surface being formed with a plurality of wiring patterns for external connection, the plurality of wiring patterns including ends arranged along edges of the lower surface at a predetermined pitch;
   electronic components mounted on at least one of the upper surface and the lower surface of the insulating substrate, the electronic components being connected to the wiring patterns;
   a pair of insulating legs arranged at the edges of the lower surface of the insulating substrate, each of the insulating legs extending in parallel to the lower surface of the insulating substrate; and
   a plurality of terminal electrodes formed on each of the legs at the predetermined pitch to extend perpendicularly to the insulating substrate, the plurality of terminal electrodes being connected to corresponding ones of the wiring patterns formed on the lower surface of the insulating substrate;
   wherein each of the legs is bonded to the insulating substrate and formed with a plurality of electrode films connected to the terminal electrodes,
   wherein each of the legs is fixed to the insulating substrate by attaching the terminal electrodes to the corresponding ones of the wiring patterns on the lower surface of the insulating substrate by soldering or by adhesion of an electroconductive paste,
   wherein each of the legs includes an outer side surface formed with a plurality of outer side grooves arranged at a predetermined pitch, and an inner side surface formed with a plurality of inner side grooves arranged correspondingly to the outer side grooves, the terminal electrodes being provided in the inner side grooves and the outer side grooves, and wherein the electrode films connect the terminal electrodes in the outer side grooves to corresponding ones of the terminal electrodes in the inner side grooves.

2. A method for manufacturing a hybrid integrated circuit device, the method comprising:

mounting an electronic component on an upper surface or a lower surface of an insulating substrate, the lower surface being formed with a plurality of wiring patterns for external connection, the wiring patterns having ends arranged along an edge of the lower surface at a predetermined pitch;

preparing an elongated, insulating leg being provided with a plurality of terminal electrodes arranged at the predetermined pitch in a longitudinal direction of the leg, the leg being attached to the insulating substrate and formed with a plurality of electrode films connected to the terminal electrodes; and fixing the leg to the edge of the lower surface of the insulating substrate by attaching the terminal electrodes on the leg to corresponding ones of the wiring patterns on the lower surface of the insulating substrate through soldering or through adhesion of an electroconductive paste;

wherein the leg includes an outer side surface formed with a plurality of outer side grooves arranged at a predetermined pitch, and an inner side surface formed with a plurality of inner side grooves arranged correspondingly to the outer side grooves, the terminal electrodes being formed in the inner side grooves and the outer side grooves, and wherein the electrode films connect the terminal electrodes in the outer side grooves to corresponding ones of the terminal electrodes in the inner side grooves.

3. The method according to claim 2, wherein the preparing of the leg comprises:

preparing a material board integrally including a plurality of legs arranged side by side;

forming a plurality of through-holes in the material board at the predetermined pitch along a boundary line between adjacent legs;

forming an electrode in each of the through-holes to form a via hole for providing a terminal electrode, and forming an electrode film on each of an upper surface and a lower surface of the material board to connect a plurality of via holes aligned in a direction perpendicular to the boundary line; and cutting the material board along the boundary line to provide separate legs.

* * * * *